(12) United States Patent
Hélot

(10) Patent No.: US 10,137,813 B2
(45) Date of Patent: Nov. 27, 2018

(54) CONTROLLING A DEVICE DEPENDENT ON THE SEAT INCLINATION

(71) Applicant: AUDI AG, Ingolstadt (DE)

(72) Inventor: Jacques Hélot, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/537,239

(22) PCT Filed: Nov. 27, 2015

(86) PCT No.: PCT/EP2015/002391
§ 371 (c)(1),
(2) Date: Jun. 16, 2017

(87) PCT Pub. No.: WO2016/096090
PCT Pub. Date: Jun. 23, 2016

(65) Prior Publication Data
US 2017/0349069 A1 Dec. 7, 2017

(30) Foreign Application Priority Data
Dec. 19, 2014 (DE) .......................... 10 2014 019 125

(51) Int. Cl.
*B60N 2/02* (2006.01)
*B60N 2/12* (2006.01)
(Continued)

(52) U.S. Cl.
CPC .............. *B60N 2/797* (2018.02); *B60N 2/02* (2013.01); *B60N 2/12* (2013.01); *B60N 2/22* (2013.01);
(Continued)

(58) Field of Classification Search
CPC ............. B60R 11/0235; B60R 11/0276; B60R 2011/0282; B60R 2011/0288;
(Continued)

(56) References Cited

U.S. PATENT DOCUMENTS 4,756,528 A 7/1988 Umashankar
2002/0139602 A1* 10/2002 Okanda .................. B60K 20/02
180/326
(Continued)

FOREIGN PATENT DOCUMENTS

DE 197 54 224 A1 6/1999
DE 199 52 894 A1 5/2001
(Continued)

OTHER PUBLICATIONS

German Office Action dated Oct. 15, 2015 from German Patent Application No. 10 2014 019 125.7, 6 pages.
(Continued)

*Primary Examiner* — Gregory A Blankenship
(74) *Attorney, Agent, or Firm* — Staas & Halsey LLP

(57) ABSTRACT

A motor vehicle includes a seat having a backrest with an adjustable backrest inclination, an interior device, and a controllable device. A touch-sensitive screen for controlling the controllable device is arranged in or on the interior device. The inclination, curvature and/or position of the touch-sensitive screen is adjustable relative to the interior device. A control device in the motor vehicle can control the inclination, curvature and/or the position of the touch-sensitive screen depending on the backrest inclination of the backrest. Therefore, a device in a motor vehicle can be controlled in a more comfortable manner by controlling the inclination, curvature, and/or the position of the device depending on the backrest inclination of the backrest of the seat in the motor vehicle.

18 Claims, 1 Drawing Sheet

(51) Int. Cl.
 *B60N 2/22* (2006.01)
 *B60N 2/75* (2018.01)
 *B60R 11/02* (2006.01)
 *H01L 27/32* (2006.01)
 *B60R 11/00* (2006.01)
 *H01L 51/52* (2006.01)

(52) U.S. Cl.
 CPC ... *B60R 11/0235* (2013.01); *B60R 2011/0043* (2013.01); *B60R 2011/0087* (2013.01); *B60R 2011/0092* (2013.01); *H01L 27/323* (2013.01); *H01L 51/52* (2013.01); *H01L 2251/5338* (2013.01)

(58) Field of Classification Search
 CPC ..... B60R 2011/0294; B60N 2/12; B60N 2/22; H01L 27/323; H01L 2251/5338
 See application file for complete search history.

(56) References Cited

U.S. PATENT DOCUMENTS

| | | | |
|---|---|---|---|
| 2003/0202005 A1* | 10/2003 | Sadahiro | H04M 1/6091 715/716 |
| 2003/0234550 A1* | 12/2003 | Brooks | B60R 7/04 296/24.46 |
| 2004/0036769 A1* | 2/2004 | Sadahiro | B60R 11/0235 348/148 |
| 2006/0262189 A1* | 11/2006 | Boundy | B60R 11/0235 348/148 |
| 2008/0106859 A1 | 5/2008 | Eguchi et al. | |
| 2008/0197683 A1 | 8/2008 | Ebbeskotte et al. | |
| 2010/0045088 A1 | 2/2010 | Kunou | |
| 2011/0193374 A1 | 8/2011 | Kim | |
| 2015/0138044 A1* | 5/2015 | Rawlinson | G06F 3/1454 345/2.2 |
| 2015/0138448 A1* | 5/2015 | Rawlinson | B60R 11/0235 348/837 |
| 2015/0375865 A1* | 12/2015 | Fischer | B60N 2/919 701/49 |
| 2017/0101032 A1* | 4/2017 | Sugioka | B60N 2/763 |
| 2017/0349069 A1* | 12/2017 | Helot | B60N 2/02 |
| 2017/0349098 A1* | 12/2017 | Uhm | B60K 28/02 |
| 2018/0006272 A1* | 1/2018 | Lee | G06F 3/0412 |
| 2018/0029501 A1* | 2/2018 | Wolf | B60N 2/06 |

FOREIGN PATENT DOCUMENTS

| | | |
|---|---|---|
| DE | 10 2005 035 111 A1 | 9/2006 |
| DE | 10 2012 216 455 A1 | 3/2014 |
| DE | 10 2014 019 125.7 | 12/2014 |
| EP | 2 147 614 A1 | 1/2010 |
| JP | 2003-317455 A | 11/2003 |
| WO | PCT/EP2015/002391 | 11/2015 |

OTHER PUBLICATIONS

International Search Report dated Feb. 4, 2016 from International Patent Application No. PCT/EP2015/002391, 4 pages.
English translation of International Preliminary Report on Patentability dated Jun. 29, 2017 from International Patent Application No. PCT/EP2015/002391, 8 pages.
Chinese Office Action dated Aug. 28, 2018 from Chinese Patent Application No. 201580068973.1, with English language translation of summary of Examiner's comments, (10 pages total).

\* cited by examiner

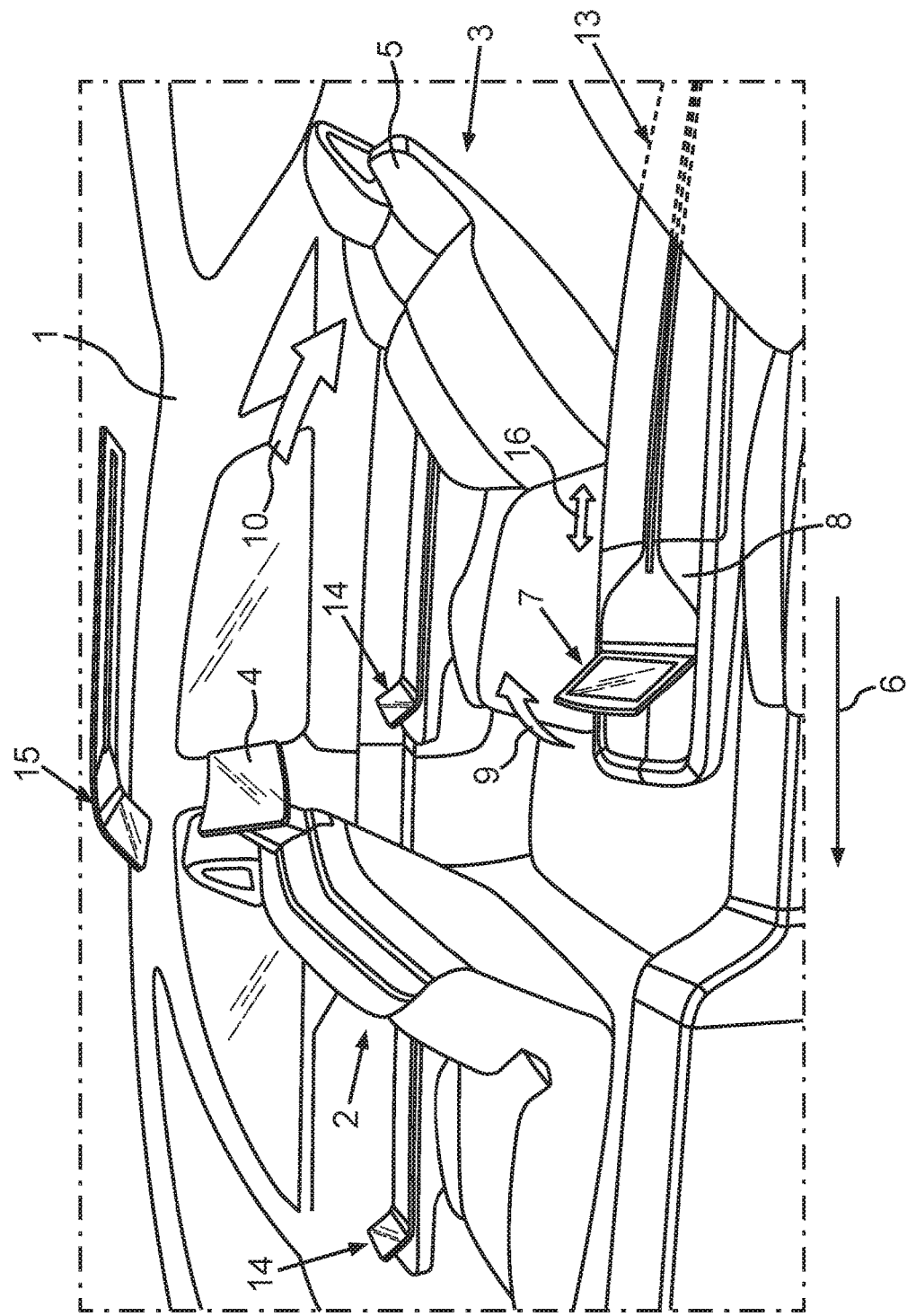

CONTROLLING A DEVICE DEPENDENT ON THE SEAT INCLINATION

CROSS REFERENCE TO RELATED APPLICATIONS

This application is a U.S. national stage of International Application No. PCT/EP2015/002391, filed on Nov. 27, 2015. The International Application claims the priority benefit of German Application No. 10 2014 019 125.7 filed on Dec. 19, 2014. Both the International Application and German Application are incorporated by reference herein in their entirety.

BACKGROUND

Described herein is a motor vehicle including a seat which has a backrest with an adjustable backrest inclination, an interior device and a controllable device. Moreover, described herein is a method for operating a corresponding motor vehicle.

Vehicles often have screens for entertaining the vehicle occupants. By way of example, such screens are also used for so-called "rear-seat entertainment systems". Such a system is intended to be used to comfortably entertain the occupants on the rear bench of a motor vehicle. For great comfort, provision may also be made for it to be possible to control the screens of this system directly by a controller or by remote control. Here, the touch-sensitive screens are advantageous in that the controller can be designed to be more intuitive and simpler. By contrast, remote controls are advantageous in that operation is also possible at a relatively large distance from the screen.

Screens of "rear-seat entertainment systems" for occupants in the second and third row of seats are fastened to the rear side of the seats respectively in front thereof. By way of example, if the seat in the second row of seats is now displaced backwards or brought into a rest position, the distance between the operating person and the screen becomes too large to allow operation of the latter by direct contact. That is to say, a remote control would be necessary in this case. However, such a remote control is disadvantageous in that it can easily be lost and, additionally, a storage space for the latter must also be provided in the interior of the motor vehicle. Moreover, two remote controls are required for the two screens in the second row of seats.

German Patent Application No. 199 52 894 A1 describes a retractable monitor or display arrangement for motor vehicles. It is mounted on a swivel arm. In order, here, to render it also usable in a motor vehicle, it is proposed that, for the purposes of an installation in the region of the back seats of motor vehicles, the monitor arrangement with swivel arms is completely retractable into the forwardly directed side of the center console assigned to one of the back seats, and removable from the same.

SUMMARY

An aspect of the disclosure provided herein discloses a motor vehicle in which the operation of a controllable device of the motor vehicle may be carried out in a more comfortable manner. Moreover, a corresponding method for operating a motor vehicle is provided.

Described herein is a motor vehicle, including a seat which has a backrest with an adjustable backrest inclination and/or the position of which is adjustable in the forward driving direction (e.g., X-direction) of the motor vehicle as provided during operation, an interior device, and a controllable device. A touch-sensitive screen for controlling the controllable device may be arranged in or on the interior device, the inclination, curvature and/or position of which relative to the interior device is adjustable in the forward driving direction (X-direction) of the motor vehicle as provided during operation, and a control device of the motor vehicle may be designed to control the inclination, curvature and/or position of the touch-sensitive screen depending on the backrest inclination of the backrest and/or the position of the seat in the forward driving direction (X-direction).

Moreover, described herein is a method for operating a motor vehicle. The motor vehicle may include a seat which has a backrest with an adjustable backrest inclination and/or the position of which is adjustable in the forward driving direction (X-direction) of the motor vehicle as provided during operation and an interior device. The method may include providing a touch-sensitive screen for controlling a controllable device, which is disposed in or on the interior device, the inclination, curvature and/or position of the touch-sensitive screen being adjustable relative to the interior device in the forward driving direction (X-direction) of the motor vehicle provided during operation. The method may further include controlling the inclination, curvature and/or position of the touch-sensitive screen depending on the backrest inclination of the backrest and/or the position of the seat in the forward driving direction (X-direction).

According to the disclosure, provision is therefore advantageously made of using a touch-sensitive screen (touch display) as a remote control for a controllable device, wherein the inclination, curvature and/or X-position of the touch-sensitive screen is made dependent upon the inclination of the backrest of the seat and/or the X-position of the seat in the motor vehicle, from which a user wishes to operate the controllable device. For example, the inclination of the touch-sensitive screen changes in the same direction or manner as that of the backrest of the seat. Hence, it is possible not only to keep the viewing angle of the operating person on the touch-sensitive screen constant within a certain range, but also to take account of the fact that the arms of the user likewise migrate backwards by the leaning the backrest backwards and thus possibly no longer reach the touch-sensitive screen as easily. The latter is counteracted by virtue of at least some of the touch-sensitive screen likewise being moved forward or backward in a manner corresponding to the backrest. Accordingly, the inclination of the whole screen, or of part of the screen, or the curvature thereof (in particular the radius of curvature thereof) may change depending on the backrest inclination of the backrest. By way of example, the inclination may relate to the forward driving direction of the motor vehicle or it may be relative to an interior device of the vehicle.

In an embodiment, the interior device is a center console between the seat and a further seat of the motor vehicle with an adjustable backrest. In this case, the touch-sensitive screen may be used as a remote control for the controllable device from both seats.

Moreover, the motor vehicle may be equipped with a detection device in order to capture which of the seats an operating action of the touch-sensitive screen is carried out from and the control device of the motor vehicle may be designed to control the inclination and/or curvature of the touch-sensitive screen depending on a backrest inclination of a backrest of that one of the seats from which the operating action is being carried out. As a result, automatically, the inclination and/or the curvature of the whole touch-sensitive screen, or a part thereof, is therefore automatically made dependent on the seat from which the operating action is being carried out. This may be realized by virtue of, for example, a camera or a photoelectric sensor identifying the direction from which the touch-sensitive screen will be touched. Accordingly, the touch sensitive screen is repositioned or swiveled before it is even touched.

Alternatively, the interior device, relative to which the inclination or curvature of the touch-sensitive screen is set, may also be a door trim or a roof module. Thus, in the case of the door trim, for example each side door includes a dedicated touch-sensitive screen such that a controller of the controllable device may be operated individually from each seat at the side facing the outside in respect of the respective seat. In this case, there would be no need for a specific recognition of the side from which the touch-sensitive screen was operated, as is required when the latter is housed in the center console. Here, it would be advantageous if the display, i.e. the touch-sensitive screen, usually lies flat in the door (in the unused state) and if it is swiveled or moved out of the door when approached.

In the case where the interior device is a roof module, the touch-sensitive screen, or a part thereof, may e.g. be pivoted out of the roofliner depending on the inclination of the backrest of the seat. In this case, the touch-sensitive screen, or a part thereof, would be set to be steeper, the steeper the backrest of the seat is. If the backrest is in the rest position, the touch-sensitive screen could be virtually parallel with the roofliner. That is to say, the touch-sensitive screen is extended or swiveled ever further out of the roofliner, the steeper the backrest is in relation to the forward driving direction.

It is particularly advantageous if the touch-sensitive screen is an OLED screen. Such screens may have a very thin embodiment and there is no need for expensive monocrystalline materials. Instead, organic, semiconducting materials are made to illuminate.

Expediently, the OLED screen has a bendable configuration. This may be realized, in particular, if the screen is constructed using thin-film technology.

In an example configuration, the controllable device is a further screen which is physically separated from the touch-sensitive screen. That is to say, the further screen is controlled by the touch-sensitive screen. Thus, the touch sensitive screen constitutes a remote control for the further screen.

The further screen may also be an OLED screen, which may have a very thin configuration.

Moreover, the further screen may be part of the rear-seat entertainment system. Such entertainment systems are widely available and may therefore make use of the embodiments described herein. However, the embodiments described herein may e.g. also be used or applied for the front passenger seat and, optionally, even for the driver seat, with the movable screen then being able to be situated in the front center console.

The features listed above in conjunction with the motor vehicle described herein may also be used to implement the method described herein. The corresponding method features emerge from the functions which satisfy the respective device features.

BRIEF DESCRIPTION OF THE DRAWINGS

These and other aspects and advantages will become more apparent and more readily appreciated from the following description of the exemplary embodiments, taken in conjunction with the attached drawing of which:

An exemplary embodiment in the single drawing illustrates a section of an interior of a motor vehicle having the touch-sensitive screen and the adjustability of the inclination or curvature of the latter.

DETAILED DESCRIPTION OF THE PREFERRED EMBODIMENT

Reference will now be made in detail to example embodiments which are illustrated in the accompanying drawing, wherein like reference numerals refer to like elements throughout.

The exemplary embodiments explained in more detail below constitute example embodiments of the disclosure. Here, it should be observed that the features may be realized not only through the specified combinations, but also on their own or in other, technically expedient combinations.

The only drawing depicts part of an interior of an exemplary motor vehicle. It is possible to recognize part of the roofliner 1 and a front passenger seat 2 and a back seat 3 arranged therebehind. Here, a screen 4, which serves to entertain a person sitting on the rear seat 3, is attached to the backrest of the front passenger seat 2. This screen 4 constitutes an example for a controllable device. Alternatives for such a controllable device would be the climate control, the illumination, the radio, etc. of the motor vehicle.

However, the screen 4 (also referred to as a "further screen") should be operated or controlled in the present case. This screen 4 may be an OLED (organic light-emitting diode) screen with an organic luminous layer. Optionally, such a screen 4 may be curved and/or removed from the rear side of the front passenger seat 2.

The backrest 5 of the rear seat 3 is swivelable. This means that the inclination of the backrest 5 can be adjusted relative to the forward driving direction 6 of the motor vehicle. If the backrest 5 of the rear seat 3 is now moved backward, the shoulders, and hence also the arms and hands, of the user sitting on the rear seat 3 move further away from e.g. the screen 4. In the rest position of the rear seat 3, depicted in the drawing, the backrest 5 thereof is reclined far toward the back. In this position, it is difficult for the user to operate the screen 4 directly. A remote control should be avoided here, as it can easily be lost.

Therefore, a touch-sensitive screen 7, which can easily be reached from the rear seat 3, even if the backrest 5 is greatly reclined, is provided to operate the screen 4 or another controllable device of the motor vehicle. So that the user may have improved sight of the touch-sensitive screen 7 as an operating element, the inclination and/or curvature thereof is adjustable relative to the forward driving direction 6 or an interior device. The adjustment is carried out by a control device which controls the inclination or curvature of the touch-sensitive screen 7 depending on the inclination of the backrest 5.

Here, the touch sensitive screen 7 is installed in a center console 8 between the rear seat 3 and the adjacent rear seat 13. The entire touch-sensitive screen 7, or at least a part thereof, is swivelable out of the center console 8 in the upward direction in relation to the forward driving direction 6, in accordance with arrow 9. If the touch-sensitive screen is a flat screen, the latter may, as a whole, be inclined upward in relation to the forward driving direction 6 or the center console 8, which in this case represents the interior device, in or on which the touch-sensitive screen 7 is mounted. However, in this case, this may also be a bendable screen, in particular an OLED screen. In this case, for example, only a part of the screen is inclined upward in accordance with arrow 9 or the radius of curvature with which the screen 7 curves is reduced such that the edges thereof move upward and against the forward driving direction 6. In principle, the bending curve of the screen 7 may assume any form which, for example, is permitted by the curveability of an OLED screen. Moreover, the screen 7, 14 optionally may also be displaceable parallel to the X-direction 6 in or on the respective interior device, in accordance with arrow 16.

As was indicated above, an aspect of the disclosure includes the inclination and/or curvature of the touch-sensitive screen 7 being dependent on the inclination of the backrest 5 of a seat, of the rear seat 3 in this case. For example, this means that the touch-sensitive screen 7 is set to be ever steeper, the flatter the backrest 5 is arranged. That is to say, if the backrest moves backward in accordance with arrow 10 in the example of the FIGURE, the edge of the touch-sensitive screen 7 situated in the forward driving direction 6 should simultaneously be moved backward and upward. For example, the two movements 9 and 10, namely that of the touch-sensitive screen 7 and that of the backrest 5, are synchronized by using the control device. Here, it is furthermore advantageous if both movements 9 and 10 are carried out in an automated fashion.

In the rest position of the rear seat 3, as depicted in the single FIGURE, the touch-sensitive screen 7 is therefore set comparatively steeply such that the user resting on the rear seat 3 can see the display on the touch-sensitive screen 7 better and can actuate corresponding buttons more easily. By contrast, if the backrest 5 is set to be steeper, the touch-sensitive screen 7 may be set to be significantly flatter or less curved such that the user can see it well, and operate it, in this seat position as well.

Typically, a screen is also situated in front of the second rear seat 13, the screen being intended to be operated by the user sitting there. Alternatively or simultaneously, this user should also be able to actuate other devices to be controlled by using the touch-sensitive screen 7, which can also be reached by the user. For this reason, it is necessary for the operating unit provided for both occupants, in this case the touch-sensitive screen 7, to be able to be operated individually by both occupants as well. By way of example, to this end, provision may be made for the respective occupant to actuate an actuation field on his side of the touch-sensitive screen 7 in order to signal to the latter which devices to be controlled are affected by the operating action. However, there may be, for example, an automatic detection of which occupant or user has undertaken an operating action on the touch-sensitive screen 7. In the example of the single FIGURE, provision can be made of photoelectric sensors on the center console, the photoelectric sensors detecting the side from which the touch-sensitive screen was operated. The right-hand screen 4 on the front passenger seat 2 for example or the screen on the driver seat is thereupon actuated in accordance with this evaluation. Such an automatic assignment of the operating action toward the respective occupant side may also be carried out by an image evaluation of images which are recorded by an interior camera. Other automatic detection systems are also conceivable in order to assign the operating action to the respective occupant or the respective occupant side of the motor vehicle interior. Optionally, two physically separated screens or screen parts, which are adjusted independently of one another in terms of their inclination or curvature, in each case depending on the assigned seat, would also be conceivable.

Even if the dependence of the inclination or curvature of the touch-sensitive screen 7 is only depicted in terms of the inclination of the backrest 5 of the rear seat 3 in the example of the single FIGURE, the inclination and/or curvature of the touch-sensitive screen 7 may also depend on the inclination of the backrest of the rear seat 13 arranged next to it. The inclination of curvature of the touch-sensitive screen 7 may also be automatically adapted to the inclination of the rear seat 13 (in each case related to the forward driving direction) in this case by virtue of the aforementioned detection device detecting that the operating action occurred precisely from the rear seat 13 and not from the rear seat 3.

In accordance with an alternative embodiment, a corresponding touch-sensitive screen for operating a device to be controlled in each case is e.g. integrated in a respective door module 14 for each of the rear seats 3 and 13. In this case, there is no need to detect the person undertaking the operating action since there precisely is no common operating device for a plurality of seats in this case.

For all of the remaining seats in the motor vehicle, it is also possible to use the function that the setting of the curvature or inclination of a touch-sensitive screen is undertaken with respect to the inclination of the backrest of the respective seat in relation to the forward driving direction or in relation to a corresponding interior part. Moreover, the operating device in the form of the touch-sensitive screen may also be integrated in a roof module 15 in the roof liner 1. In this case too, this may relate to a seat-related operating screen or a common operating screen for a plurality of seats. In any case, this allows a free remote control to be dispensed with.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A motor vehicle, comprising:
   a seat having a backrest with an adjustable backrest inclination and/or a position of the seat being adjustable in a forward driving direction of the motor vehicle as provided during operation;
   an interior device;
   a controllable device;
   a touch-sensitive screen, disposed in or on the interior device, configured to control the controllable device, the controllable device being a further screen physically separated from the touch-sensitive screen, at least one of an inclination, curvature, and a position of the touch-sensitive screen being adjustable relative to the interior device in the forward driving direction; and
   a control device configured to control the at least one of the inclination, curvature and the position of the touch-sensitive screen based on at least one of the backrest inclination of the backrest and the position of the seat in the forward driving direction.

2. The motor vehicle according to claim 1, further comprising a further seat having an adjustable backrest,
   wherein the interior device is a center console disposed between the seat and the further seat.

3. The motor vehicle according to claim 2, further comprising a detector configured to determine whether an operating action of the touch-sensitive screen is carried out from the seat or the further seat, and
   wherein the control device is further configured to control at least one of the inclination and the curvature of the touch-sensitive screen based on a backrest inclination of the backrest corresponding to one of the seat and the further seat that is determined by the detector as a seat from which the operating action is carried out.

4. The motor vehicle according to claim 1, wherein the interior device is a door trim or a roof module.

5. The motor vehicle according to claim 1, wherein the touch-sensitive screen is an organic light-emitting diode (OLED) screen.

6. The motor vehicle according to claim 5, wherein the OLED screen is bendable.

7. The motor vehicle according to claim 1, wherein the further screen is an organic light-emitting diode (OLED) screen.

8. The motor vehicle according to claim 1, wherein the further screen is part of a rear-seat entertainment system.

9. A method for operating a motor vehicle including a seat having a backrest with an adjustable backrest inclination and/or a position of the seat being adjustable in a forward driving direction of the motor vehicle as provided during operation, an interior device, and a controllable device, the method comprising:
 controlling the controllable device using a touch-sensitive screen disposed in or on the interior device, the controllable device being a further screen physically separated from the touch-sensitive screen, at least one of an inclination, curvature, and a position of the touch-sensitive screen being adjustable relative to the interior device in the forward driving direction; and
 controlling, by a control device, at least one of the inclination, the curvature, and the position of the touch-sensitive screen based on at least one of the backrest inclination of the backrest and the position of the seat in the forward driving direction.

10. The method according to claim 9, wherein the controlling includes automatically moving the position of the touch-sensitive screen rearward in response to decreasing the backrest inclination of the backrest.

11. The method according to claim 9, wherein the controlling includes automatically increasing the inclination of the touch-sensitive screen in response to decreasing the backrest inclination of the backrest.

12. The method according to claim 9, wherein the controlling includes automatically decreasing the curvature of the touch-sensitive screen in response to decreasing the backrest inclination of the backrest.

13. The method according to claim 9, further comprising determining whether an operating action of the touch-sensitive screen is carried out from the seat or a further seat, and
 wherein the controlling includes controlling at least one of the inclination and the curvature of the touch-sensitive screen based on a backrest inclination of the backrest corresponding to one of the seat and the further seat that is determined as a seat from which the operating action is carried out.

14. A motor vehicle, comprising:
 a first seat having a first backrest with an adjustable backrest inclination, a position of the first seat being adjustable in a forward and a rearward direction;
 a second seat having a second backrest with an adjustable backrest inclination, a position of the second seat being adjustable in the forward and the rearward direction;
 a first screen, disposed remotely from the first seat, configured to display content;
 a touch-sensitive screen, physically separated from the first screen, configured to control an operation of the first screen;
 an interior device at which the touch-sensitive screen is disposed; and
 a control device configured to automatically control at least one of an inclination, a curvature and a position of the touch-sensitive screen based on at least one of the backrest inclination of the first backrest and the position of the first seat or based on at least one of the backrest inclination of the second backrest and the position of the second seat.

15. The motor vehicle according to claim 14, wherein
 the interior device includes a center console disposed between the first seat and the second seat,
 the touch-sensitive screen is disposed at the center console, and
 the control device is configured to control at least one of the inclination, the curvature and the position of the touch-sensitive screen based on whether the touch-sensitive screen is operated from the first seat or the second seat.

16. The motor vehicle according to claim 15, further comprising a detector configured to determine whether the touch-sensitive screen is operated from the first seat or the second seat.

17. The motor vehicle according to claim 14, wherein
 the interior device includes a roof module disposed above the first seat and the second seat,
 the touch-sensitive screen is disposed at the roof module, and
 the control device is configured to control at least one of the inclination, the curvature and the position of the touch-sensitive screen based on whether the touch-sensitive screen is operated from the first seat or the second seat.

18. The motor vehicle according to claim 14, wherein movement of the touch-sensitive screen and that of the first backrest are synchronized using the control device, such that when the backrest inclination of the first backrest is changed, the control device automatically changes at least one of the inclination, the curvature and the position of the touch-sensitive screen.

* * * * *